US008473820B2

(12) United States Patent
Shin et al.

(10) Patent No.: US 8,473,820 B2
(45) Date of Patent: Jun. 25, 2013

(54) APPARATUS AND METHOD FOR TRANSMITTING AND RECEIVING DATA

(75) Inventors: Jong-Yoon Shin, Daejeon (KR); Jongho Kim, Daejeon (KR); Je Soo Ko, Daejeon (KR); Kwangjoon Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 482 days.

(21) Appl. No.: 12/781,953

(22) Filed: May 18, 2010

(65) Prior Publication Data

US 2010/0299578 A1    Nov. 25, 2010

(30) Foreign Application Priority Data

May 19, 2009 (KR) .................. 10-2009-0043318
Oct. 22, 2009 (KR) .................. 10-2009-0100915

(51) Int. Cl.
*H03M 13/00* (2006.01)
*H03M 13/03* (2006.01)

(52) U.S. Cl.
USPC ......................................... 714/776; 714/787

(58) Field of Classification Search
None
See application file for complete search history.

(56) References Cited

U.S. PATENT DOCUMENTS

| 4,071,887 | A  | * | 1/1978  | Daly et al. ..................... 710/305 |
| 5,959,990 | A  | * | 9/1999  | Frantz et al. .................. 370/392 |
| 6,704,326 | B2 | * | 3/2004  | Russell et al. ................ 370/466 |
| 6,868,514 | B2 |   | 3/2005  | Kubo et al. |
| 7,369,496 | B1 | * | 5/2008  | Wiggins et al. ............... 370/235 |
| 7,586,941 | B2 | * | 9/2009  | Gonda .......................... 370/466 |
| 7,664,067 | B2 | * | 2/2010  | Pointer ......................... 370/328 |
| 7,760,752 | B2 | * | 7/2010  | Dropps et al. ................ 370/437 |
| 7,782,812 | B2 | * | 8/2010  | Jao ................................ 370/321 |
| 2010/0254493 | A1 | * | 10/2010 | Yang ............................. 375/340 |
| 2010/0281343 | A1 | * | 11/2010 | Caggioni et al. .............. 714/776 |

* cited by examiner

*Primary Examiner* — Ajay Bhatia
*Assistant Examiner* — Daniel McMahon
(74) *Attorney, Agent, or Firm* — Ladas & Parry LLP

(57) ABSTRACT

A transmitting apparatus in a transport network, which performs forward error correcting encoding for each virtual lane set, which is a multiple of the number of transmission channels, in order to generate virtual frames including independent parity bytes for each of the virtual lanes. These generated virtual frames are transmitted through at least one transmission channel. A receiving apparatus for detecting the virtual frames for each virtual lane from a signal received through a transmission channel by using a frame assignment sequence, and performing forward error correcting decoding by using the parity bytes included in the virtual frames detected for each virtual lane.

16 Claims, 17 Drawing Sheets

FIG. 2

| | Column # | | | | | | | | |
|---|---|---|---|---|---|---|---|---|---|
| | 1 | ... | 14 | 15 | 16 | 17 | 3824 | 3825 | ... 4080 |
| 1 | FA OH | | OTUk OH | | | OTUk payload = ODUk | | Row 1 Parity Bytes | |
| 2 | | | | | | | | Row 2 Parity Bytes | |
| 3 | | | | | | | | Row 3 Parity Bytes | |
| 4 | | | | | | | | Row 4 Parity Bytes | |

Row #

FIG. 3

| | 1 | | | | 4080 |
|---|---|---|---|---|---|
| Lane 1 | 1:16(FAS) | 17:32 | 33:48 | 49:64 | ⋯ | 4065:4080 |
| Lane 2 | 4081:4096 | 4097:5012 | 5013:5028 | 5029:5044 | | 9145:9160 |
| Lane 3 | 9161:9176 | 9177:9192 | 9193:9208 | 9209:9224 | | 12225:12240 |
| Lane 4 | 12241:12256 | 12257:12272 | 12273:12288 | 12289:12304 | | 16305:16320 |

FIG. 8

| | 1 | 16 17 | 32 | ... | 3809 | 3824 3825 | 4080 | 1 | ... | 16 | ... | 3809 | 3824 3825 | 4080 | 1 | ... | 16 | |
|---|---|---|---|---|---|---|---|---|---|---|---|---|---|---|---|---|---|---|
| Lane 1 | 1:16(FAS) | 17:32 | | | 3809:3824 | lane 1 parity bytes[1:256] | | 11473:11488 | | | | 15281:15296 | lane 1 parity bytes[1:256] | | | 7649:7664 | | |
| Lane 2 | 3825:3840 | 3841:3856 | | | 7633:7648 | lane 2 parity bytes[1:256] | | 1:16(FAS) | | | | 3809:3824 | lane 2 parity bytes[1:256] | | | 11473:11488 | | |
| Lane 3 | 7649:7664 | 7665:7680 | | | 11457:11472 | lane 3 parity bytes[1:256] | | 3825:3840 | | | | 7633:7648 | lane 3 parity bytes[1:256] | | | 1:16(FAS) | | |
| Lane 4 | 11473:11488 | 11489:11504 | | | 15281:15296 | lane 4 parity bytes[1:256] | | 7649:7664 | | | | 11457:11472 | lane 4 parity bytes[1:256] | | | 3825:3840 | | |

FIG. 9

| | 1 | 16 | 17 | 32 | ... | 3809 | 3824 | 3825 | 4080 | 1 | 16 | ... | 3809 | 3824 | 3825 | 4080 | 1 | 16 | ... |
|---|---|---|---|---|---|---|---|---|---|---|---|---|---|---|---|---|---|---|---|
| Lane 1 | 1:16(FAS) | | 65:80 | | ... | 15233:15248 | | lane 1 parity bytes[1:256] | | 49:64 | | ... | 15281:15296 | | lane 1 parity bytes[1:256] | | 33:48 | | ... |
| Lane 2 | 17:32 | | 81:96 | | ... | 15249:15264 | | lane 2 parity bytes[1:256] | | 1:16(FAS) | | ... | 15233:15248 | | lane 2 parity bytes[1:256] | | 49:64 | | ... |
| Lane 3 | 33:48 | | 97:112 | | ... | 15265:15280 | | lane 3 parity bytes[1:256] | | 17:32 | | ... | 15249:15264 | | lane 3 parity bytes[1:256] | | 1:16(FAS) | | ... |
| Lane 4 | 49:64 | | 113:128 | | ... | 15281:15296 | | lane 4 parity bytes[1:256] | | 33:48 | | ... | 15265:15280 | | lane 4 parity bytes[1:256] | | 17:32 | | ... |

FIG. 10

| | 1 | 16 17 | 17:32 | 32 33 | 3808 3809 | 3809:3824 | 3824 3825 | 3825 3908 3909 | 4084 1 | 16 17 | 3808 |
|---|---|---|---|---|---|---|---|---|---|---|---|
| Lane 1 | 1:16(FAS) | | 17:32 | | ... | 3809:3824 | | lane 1 Outer FEC[1:84] | Fixed Stuff (all-0's) | 11473:11488 | ... |
| Lane 2 | 3825:3840 | | 3841:3856 | | | 7633:7648 | | lane 2 Outer FEC[1:84] | | 1:16(FAS) | |
| Lane 3 | 7649:7664 | | 7665:7680 | | | 11457:11472 | | lane 3 Outer FEC[1:84] | | 3825:3840 | |
| Lane 4 | 11473:11488 | | 11489:11504 | | | 15281:15296 | | lane 4 Outer FEC[1:84] | | 7649:7664 | |

FIG. 12

| Lane | 1 | 16 17 | 32 33 | 3808 3809 | 3824 3825 | 3908 3909 | 4084 | 16 17 | 3808 |
|---|---|---|---|---|---|---|---|---|---|
| Lane 1 | 1:16(FAS) | 17:32 | ... | 15233:15248 | lane 1 Outer FEC[1:84] | lane 1 Inner FEC[1:84] | | 11473:11488 | |
| Lane 2 | 3825:3840 | 3841:3856 | | 15249:15264 | lane 2 Outer FEC[1:84] | lane 2 Inner FEC[1:84] | | 1:16(FAS) | ... |
| Lane 3 | 7649:7664 | 7665:7680 | | 15265:15280 | lane 3 Outer FEC[1:84] | lane 3 Inner FEC[1:84] | | 3825:3840 | |
| Lane 4 | 11473:11488 | 11489:11504 | | 15281:15296 | lane 4 Outer FEC[1:84] | lane 4 Inner FEC[1:84] | | 7649:7664 | |

APPARATUS AND METHOD FOR TRANSMITTING AND RECEIVING DATA

CROSS-REFERENCE TO RELATED APPLICATION

This application claims priority to and the benefit of Korean Patent Application Nos. 10-2009-0043318 and 10-2009-0100915 filed in the Korean Intellectual Property Office on May 19, 2009 and Oct. 22, 2009, the entire contents of which are incorporated herein by reference.

BACKGROUND OF THE INVENTION (a) Field of the Invention

The present invention relates to an apparatus and method for transmitting data, and an apparatus and method for receiving data. More specifically, the present invention relates to an apparatus and method for transmitting data and an apparatus and method for receiving data in a transport network.

(b) Description of the Related Art

In an optical transport network, forward error correcting (hereinafter referred to as "FEC") is performed in order to increase transmission performance. Thereby, one optical transport unit (OTU) is configured to include an optical channel data unit (hereinafter referred to as "ODU") that corresponds to information data including overhead and payload information data, and parity bytes for correcting the ODU.

Meanwhile, in order to rapidly transmit OTU3, which shows a bit rate of approximately 43.018 Gbit/s in the related art, at a high speed, a method for transmitting OTU3 through a single optical channel by applying a simple modulation scheme such as non-return-to-zero (NRZ), differential phase shift keying (DPSK), etc., in a single wavelength has been used.

Currently, studies of high-speed transmission, such as OTU4 showing a bit rate of approximately 111.8 Gbit/s as well as OTU3, has been undertaken. However, this has problems of a technical limit of an optical module, high price, etc. As a result, a method for transmitting data in parallel through a multi-channel is being considered. As methods for transmitting data in parallel through a multi-channel, a method for transmitting data using different wavelengths for each channel, a method for transmitting data through different optical fibers or optical/electric cables for each channel, a method for transmitting through one optical wavelength and optical fiber but transmitting several bits per symbol using a polarization multiplexing and multi-level modulation scheme, etc., are used.

Meanwhile, in order to transmit data through the multi-channel in the related art, a method that distributes the OTU to each channel in a bit unit and transmits and receives it has been used. However, in the case of using the method, it is difficult to restore the OTU signal at a receiving end due to the occurrence of the delay difference for each channel upon transmitting data. In addition, even though the delay is compensated externally, since a parity byte is also assigned to each channel in bit units upon transmitting the OTU, the inter-channel error correcting performance has been affected.

The above information disclosed in this Background section is only for enhancement of understanding of the background of the invention, and therefore it may contain information that does not form the prior art that is already known in this country to a person of ordinary skill in the art.

SUMMARY OF THE INVENTION

The present invention has been made in an effort to provide an apparatus and method for transmitting data and an apparatus and method for receiving data that can efficiently perform an error correcting function when transmitting data in parallel through multiple transmission channels in an optical transport network.

In order to achieve the object, an exemplary embodiment of the present invention provides a method for transmitting data by a transmitting apparatus in a transport network, including: generating parity bytes by performing forward error correcting encoding on input information data; dividing the information data and the parity bytes into a plurality of blocks; generating frames including a plurality of virtual frames corresponding to a plurality of virtual lanes by mapping the plurality of blocks to the plurality of virtual lanes; and transmitting the frames through at least one transmission channel.

Another exemplary embodiment of the present invention provides a method for receiving data by a receiving apparatus in a transport network, including: detecting a plurality of virtual frames each corresponding to a plurality of virtual lanes by using a frame assignment sequence included in signals received through at least one transmission channel; dividing the plurality of virtual frames into a plurality of blocks; generating information data and parity bytes by demapping the plurality of blocks; performing error correction on the information data based on the parity bytes; and generating transmission data based on the error corrected information data.

Yet another exemplary embodiment of the present invention provides a method for transmitting data by a transmitting apparatus in a transport network, including: dividing input information data into a plurality of blocks; mapping the plurality of blocks to a plurality of virtual lanes; generating parity bytes for the plurality of virtual lanes by performing forward error correcting encoding on the plurality of virtual lanes; generating virtual frames including the corresponding blocks and the corresponding parity bytes of the plurality of blocks for each of the plurality of virtual lanes; and transmitting the plurality of virtual frames generated for each of the plurality of virtual lanes through at least one transmission channel.

Still another exemplary embodiment of the present invention provides a method for receiving data by a receiving apparatus in a transport network, including: detecting a frame assignment sequence included in a signal received through at least one transmission channel; detecting virtual frames including information data and parity bytes for each of a plurality of virtual lanes by using the frame assignment sequence; performing error correction on the information data and the parity bytes by performing forward error correcting decoding on each of the plurality of virtual lanes; and outputting a transmission data by demapping the error corrected information data.

BRIEF DESCRIPTION OF THE DRAWINGS

FIG. 2 is a configuration diagram schematically showing an OTU according to the first exemplary embodiment of the present invention;

FIGS. 3 and 4 are configuration diagrams showing one example of frames according to the first exemplary embodiment of the present invention;

FIGS. 8 to 10 show one example of frames for each virtual lane according to the second exemplary embodiment of the present invention;

FIG. 12 is a diagram showing one example of using a concatenated BCH-BCH encoding method according to the second exemplary embodiment of the present invention;

DETAILED DESCRIPTION OF THE EMBODIMENTS

Figure 1:
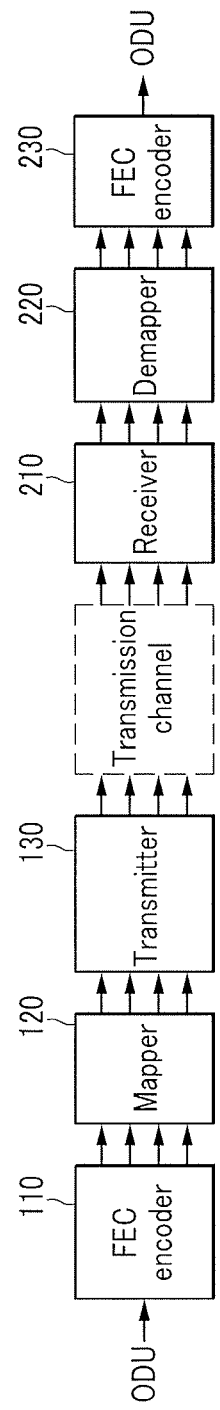
FIG. 1 a schematic block diagram showing a transmitting/receiving apparatus in an optical transport network according to a first exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

In the specification, unless explicitly described to the contrary, the word "comprise" and variations such as "comprises" or "comprising" will be understood to imply the inclusion of stated elements but not the exclusion of any other elements.

Hereinafter, a method and apparatus for transmitting data and a method and apparatus for receiving data in an optical transport network according to an exemplary embodiment of the present invention will be described in detail with reference to the accompanying drawings.

Hereinafter, although a transmitting/receiving apparatus with one or four transmission channels corresponding to an optical channel that actually transmits data will be described by way of example, the present invention can be also applied to the case where there are four or more transmission channels.

In addition, an exemplary embodiment of the present invention uses a method that forms a plurality of transmission channels using different optical wavelengths and different transmission paths (e.g., optical fiber, optical cable, electric cable, etc.) or transmits a plurality of bits per one symbol such as dual polarization-quadrature phase shift keying (DP-QPSK) which is one of multi-level modulation schemes, thereby making it possible to form a plurality of transmission channels. For example, when forming the transmission channel using the optical wavelength, in order to form four transmission channels, four optical wavelengths are needed. Further, when forming the transmission channels using the transmission paths, in order to form four transmission channels, four transmission paths (e.g., optical fiber, optical cable, electric cable, etc.) are needed. Further, when forming the transmission channels using the dual polarization-quadrature phase shift keying (DP-QPSK), which is one of multi-level modulation schemes, in order to form four transmission channels, a method for transmitting 4 bits per symbol is used.

Next, referring to FIGS. 1 to 6, the method and apparatus for transmitting data and the method and apparatus for receiving data in the optical transport network according to the first exemplary embodiment of the present invention will be described in detail.

Figure 4:
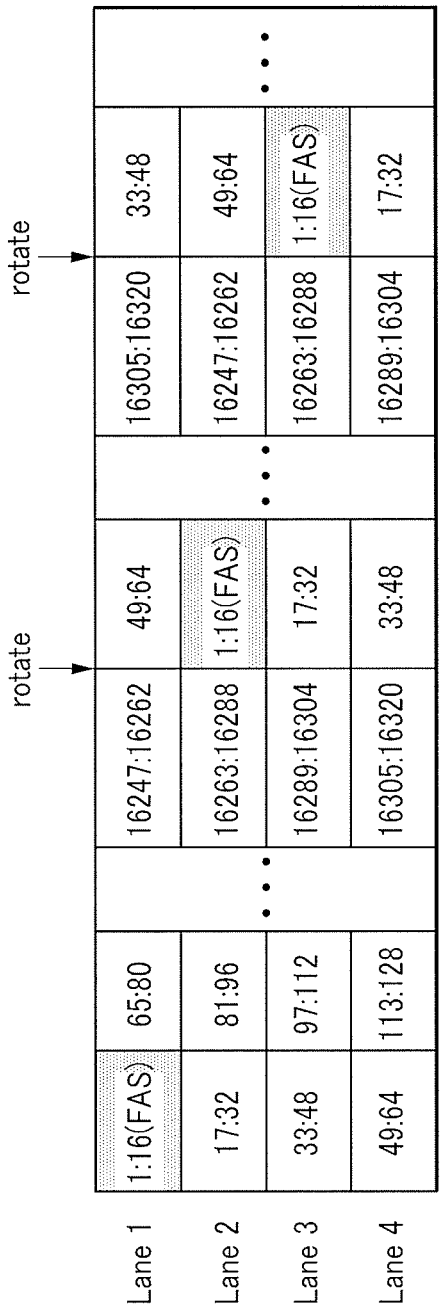

FIG. 1 is a schematic structure diagram showing a transmitting/receiving apparatus in an optical transport network according to a first exemplary embodiment of the present invention. In addition, FIG. 2 is a configuration diagram schematically showing an OTU according to the first exemplary embodiment of the present invention, and FIGS. 3 and 4 are configuration diagrams showing one example of frames according to the first exemplary embodiment of the present invention.

Referring to FIG. 1, the transmitting apparatus includes an FEC encoder 110, a mapper 120, and a transmitter 130.

The FEC encoder 110 performs the FEC encoding on the input ODU to generate parity bytes for error correction of the ODU. As shown in FIG. 2, it generates and outputs an OTU that includes the ODU and the parity bytes generated by performing the FEC encoding on the ODU. Herein, the FEC encoder 110 can use a 16 channel Reed-Solomon (RS) (255, 239) encoding method as the FEC decoding method.

Referring to FIG. 2, $ODU_k$ (k=1 and 2, 3) is information data that include overhead (FA OH, $OTU_k$ OH) and payload ($OTU_k$ payload), and the FEC encoder 120 generates parity bytes of 4×256 bytes in order to perform error correct on $ODU_k$. In addition, the FEC encoder 120 adds parity bytes of 256 bytes to each row of $ODU_k$ to generate $OTU_k$ (k=1, 2, 3, 4).

Referring again to FIG. 1, the mapper 120 divides the OTU including the information data and the parity bytes into blocks of 16 byte units. As shown in FIG. 3, the mapper 120 performs mapping for each of a plurality of virtual lanes to generate the virtual frames. Meanwhile, although the first exemplary embodiment of the present invention describes a case of dividing the size of the blocks in 16 byte units by way of example, the present invention can also change the size of the blocks into 8 bytes, 32 bytes, etc.

Also, the mapper 120 assigns the frame assignment sequence (hereinafter referred to as "FAS") to one of the plurality of virtual lanes at each frame period. Herein, the virtual lane in which the FAS is positioned is selected to be circulated at each frame period, and the FAS is assigned to a first block of the blocks is mapped to the selected virtual lane. Referring to FIG. 4, when there are 4 virtual lanes (lane 1 to lane 4), the mapper 120 assigns the FAS to the first block of lane 1 at the first frame period. The FAS is assigned to the first block of lane 2 at the next frame period and the FAS is assigned to the first block of lane 3 at the following frame period.

The transmitter 130 generates the transmission frame including the plurality of virtual frames when the virtual frames corresponding to each of the plurality of virtual lanes are generated in the mapper 120. It transmits this through at least one transmission channel.

Meanwhile, in the first exemplary embodiment of the present invention, the mapper 120 can map the blocks using the following two methods.

First, the mapper 120 can use a method that divides the information data and parity bytes into blocks in 16 byte units and sequentially assigns each block to each virtual lane. In this case, as shown in FIG. 4, the mapper 120 sequentially assigns the blocks divided in 16 byte units to each virtual lane (lane 1-lane 4).

Second, the mapper 120 can use a method that generates a plurality of groups that group a plurality of consecutive blocks and maps each group to each virtual lane. Herein, the number of generated groups is the same as the number of virtual lanes, and one group is mapped to one virtual lane. Meanwhile, in this case, the mapper 120 performs the grouping in 4080 byte (255 blocks) units and maps the groups of a 4080 byte size to each virtual lane (lane 1 to lane 4), as shown in FIG. 2. Therefore, since the mapper 120 needs a memory of 4080 bytes for each group during the grouping, it increases the memory amount as compared to the first method. Moreover, it causes considerable delay by grouping each block in the plurality of groups and then performing the mapping for each virtual lane.

Meanwhile, although an exemplary embodiment of the present invention describes the case where the number of virtual lanes is four by way of example, the present invention can be applied even when the number of virtual lanes is two or more. Herein, the number of virtual lanes can be changed according to the number of transmission channels, and the virtual lanes can be implemented as a multiple of the number of transmission channels. For example, when there are four transmission channels, the number of virtual lanes may be 4, 8, 12, 16, 20, . . . , etc.

Referring again to FIG. 1, the receiving apparatus includes a receiver 210, a demapper 220, and an FEC decoder 230.

The receiver 210 detects the virtual frames for each virtual lane by using the FAS included in signals received through at least one transmission channel. The receiver compensates and outputs the delay between the virtual lanes of the virtual frame, which is detected based on the FAS position in the detected virtual frame. Herein, when the transmitting apparatus transmits data, since it is selects the virtual lane to be circulated, to which the FAS is assigned at each frame period and transmits the FAS through the first block of the selected virtual lane, the receiver 210 can confirm the position of the virtual frame for each virtual lane according to the FAS position.

The demapper 220 divides the virtual frames of each virtual lane, which are delay-compensated and output in the receiver 210, into the blocks in 16 byte units, and demaps each block and outputs the OTU form including the information data and the parity bytes. Although the first exemplary embodiment of the present invention describes the case where the block size is divided into 16 byte units by way of example, the present invention can change the size of the block to 8 bytes, 32 bytes, etc.

The FEC decoder 230 uses the parity bytes that are demapped and output in the demapper 220 to perform the FEC decoding, thereby performing the error correction on the information data. It outputs the ODU including the error corrected information data.

Meanwhile, as the FEC decoding method in the first exemplary embodiment of the present invention, a 16 channel RS (255, 239) decoding method can be used. Therefore, the error correction of up to 128 bytes is performed on all the virtual lanes.

Figure 5:
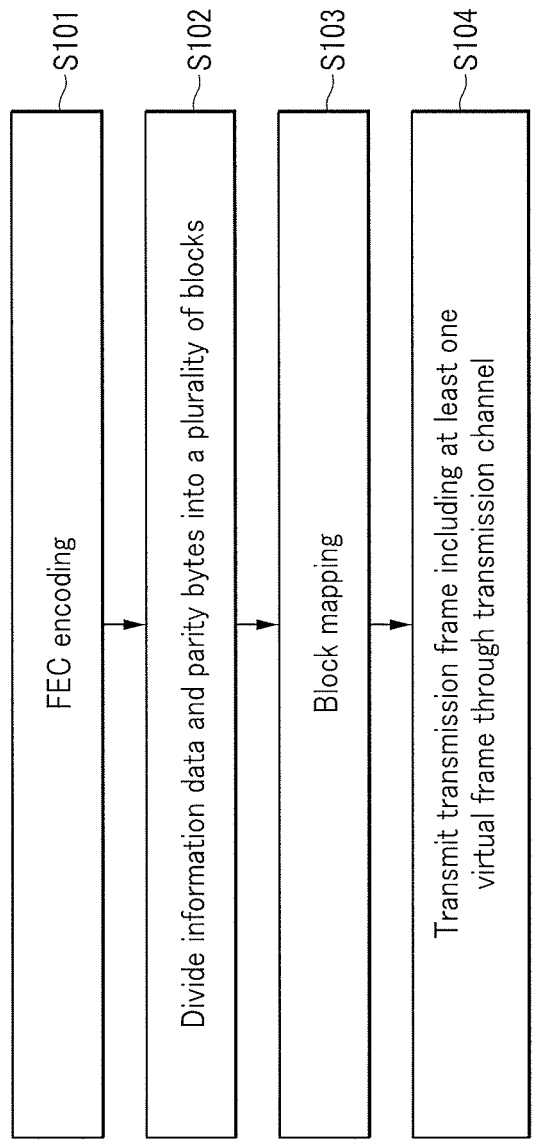
FIG. 5 is a flowchart showing a method for transmitting data in the optical transport network according to the first exemplary embodiment of the present invention.

FIG. 5 is a flowchart showing a method for transmitting data in the optical transport network according to the first exemplary embodiment of the present invention.

Referring to FIG. 5, the transmitting apparatus performs the FEC encoding on the information data input through the FEC encoder 110 to generate the parity bytes (S101). It divides the OTU including the information data and the parity bytes into the plurality of blocks through the mapper 120 (S102). In addition, it generates the virtual frames for each virtual lane by mapping each block to the virtual lane (S103). Herein, the number of virtual lanes is set as a multiple of the number of transmission channels, and as the mapping method, a method for sequentially assigning blocks to each virtual lane or a method for grouping a plurality of consecutive blocks to a group corresponding to the number of virtual lanes and then mapping each group to each virtual lane is used.

When the virtual frames of each virtual lane are generated, the transmitting apparatus generates the transmission frame including the virtual frames through the transmitter 130 and transmits this to at least one transmission channel (S104). At this time, the transmitter 130 transmits one virtual frame through only one transmission channel.

Figure 6:
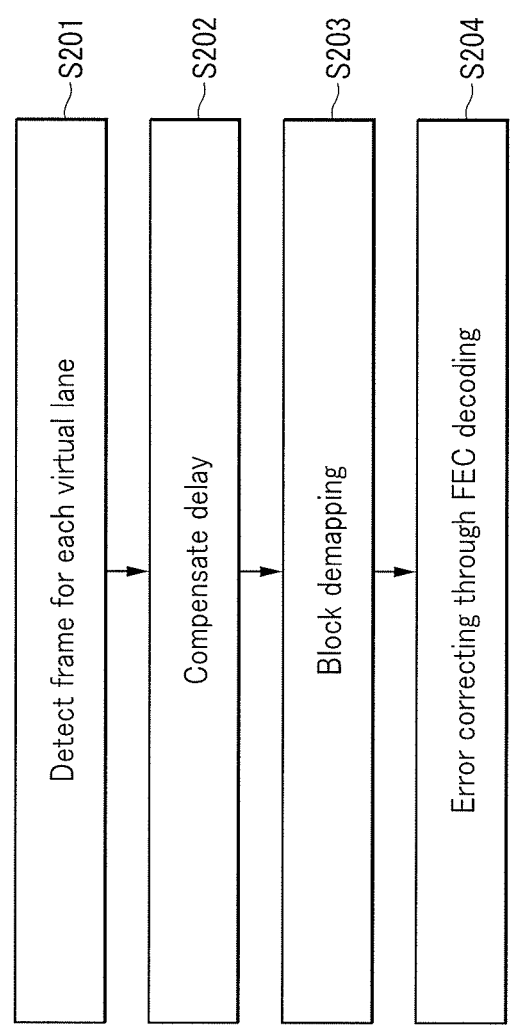
FIG. 6 is a flowchart showing a method for receiving data in the optical transport network according to the first exemplary embodiment of the present invention.

FIG. 6 is a flowchart showing a method for receiving data in the optical transport network according to the first exemplary embodiment of the present invention.

Referring to FIG. 6, the receiving apparatus detects the virtual frames for each virtual lane from the signal received through the receiver 210 (S201). It compensates and outputs the delay of the virtual frame detected for each virtual lane (S202). Herein, the receiver 210 detects the FAS included in the received signal and uses it to confirm the position of the virtual frame corresponding to each virtual lane, thereby compensating the delay between the virtual lanes.

Thereafter, the receiving apparatus divides the virtual frames of each virtual lane, which are delay-compensated and output through the demapper 220, into the plurality of blocks in 16 byte units. It restores the parity bytes and the information data by demapping each block, and outputs the OTU including the restored information data and parity bytes (S203).

Thereafter, the receiving apparatus performs the FEC decoding on the OTU through the FEC decoder 230, thereby performing the error correction on the information data (S204). It outputs the ODU including the error corrected information data.

As described above, the first exemplary embodiment of the present invention divides the OTU including all the information data and the parity bytes into the plurality of blocks and maps each block by each of the plurality of virtual lanes, thereby generating the virtual frames corresponding to each virtual lane. It transmits the transmission frame including the virtual frames through at least one transmission channel.

Therefore, the parity bytes corresponding to each row of the information data are divided and transmitted to at least one virtual lane, and the errors occurring in one virtual lane have an effect on the error correcting performance of other virtual lanes. For example, when errors of 8 bytes at one frame period occur in one of n virtual lanes by any external factors, if burst errors of 120 bytes or more occur in the remaining virtual lanes, the error correction is not performed.

In addition, when there are n virtual lanes, if burst errors of 128/n bytes or more simultaneously occur in n virtual lanes, it is impossible to perform the error correction. For example, when there are two virtual lanes, if burst errors of 64 bytes or more simultaneously occur in two virtual lanes, it is impossible to perform the error correction.

Therefore, in the transmitting/receiving apparatus according to the first exemplary embodiment of the present invention, the error correction performance of each virtual lane is affected by the number of virtual lanes, such that the entire error correction performance of the transmitting/receiving apparatus may be deteriorated.

Next, the method and apparatus for transmitting data and the method and apparatus for receiving data in the optical transport network according to the second exemplary embodiment of the present invention will be described in detail with reference to FIGS. 7 to 17.

Figure 7:
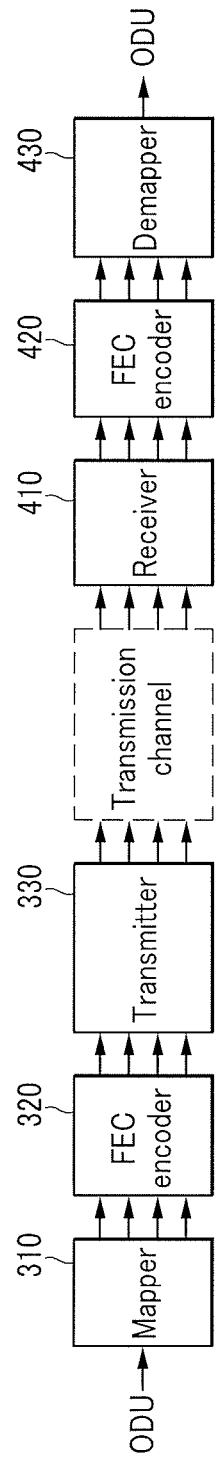
FIG. 7 is a schematic block diagram showing a transmitting/receiving apparatus in an optical transport network according to a second exemplary embodiment of the present invention.

FIG. 7 is a schematic block diagram showing a transmitting/receiving apparatus in an optical transport network according to a second exemplary embodiment of the present invention. FIGS. 8 to 10 show one example of frames for each virtual lane according to the second exemplary embodiment of the present invention.

Figure 11:
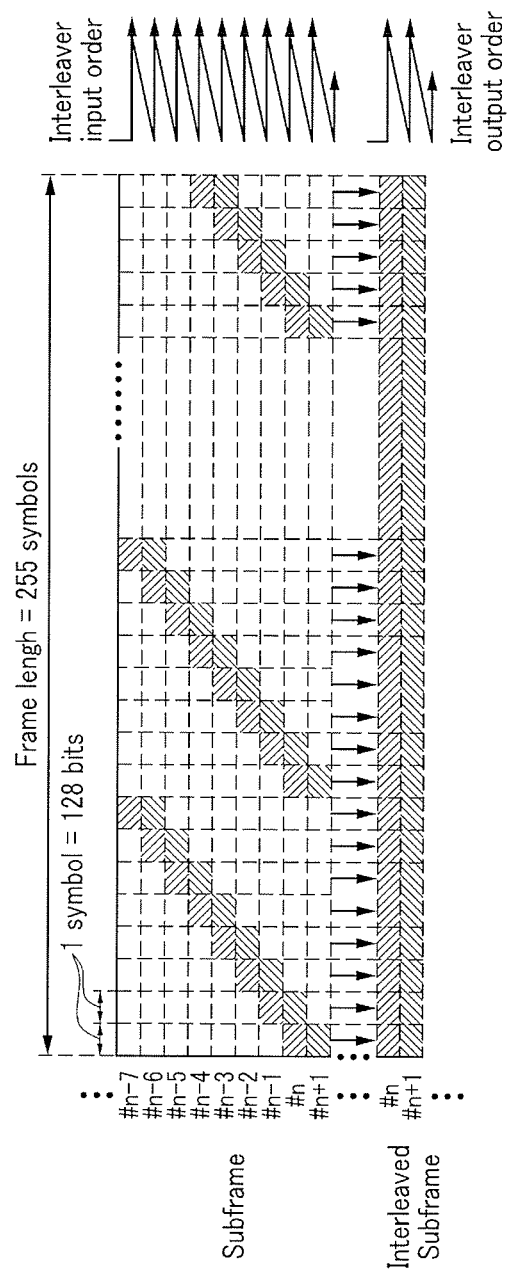
FIG. 11 shows one example of interleaving of a subframe according to the second exemplary embodiment of the present invention.
Figure 13:
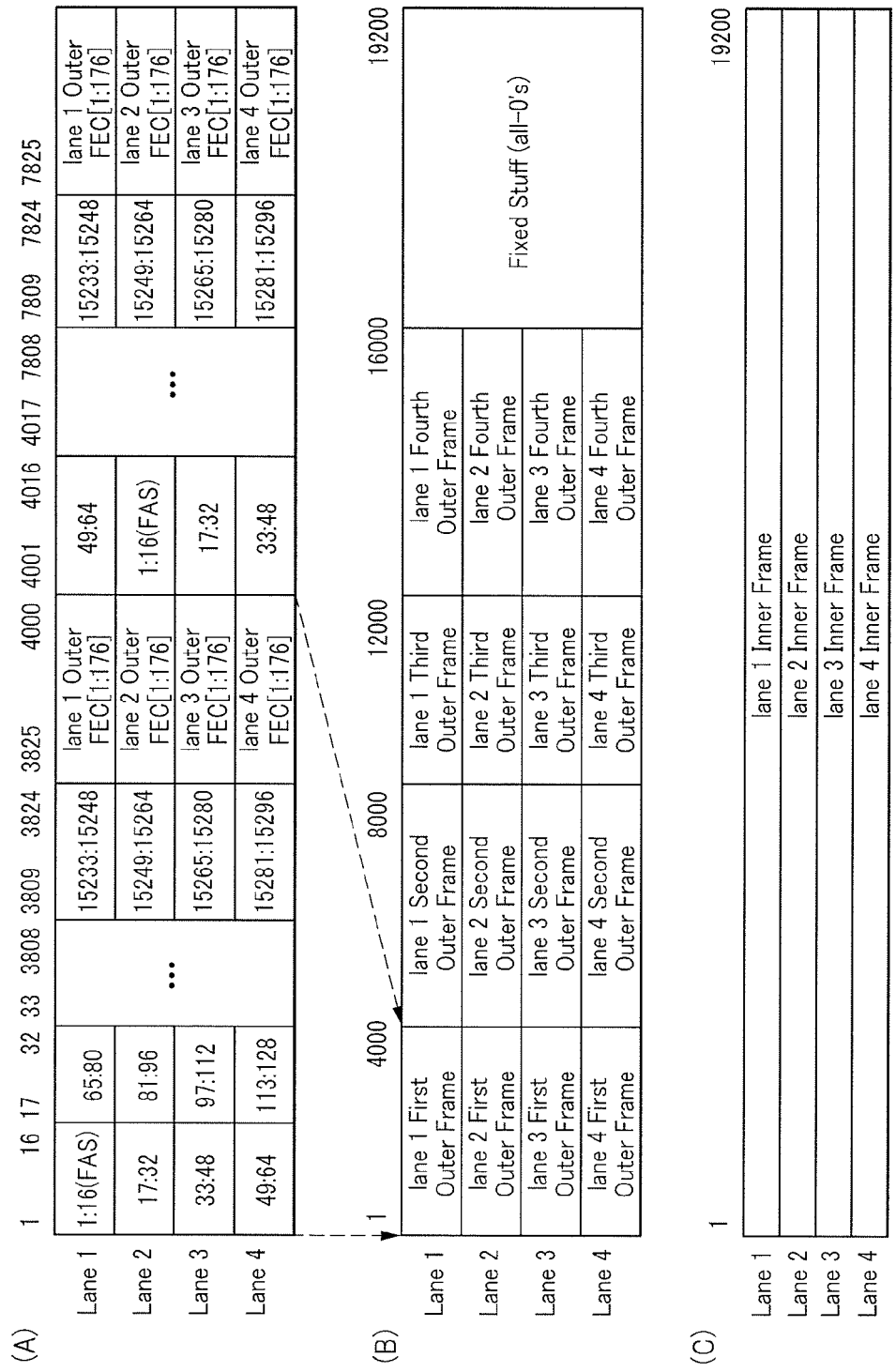
FIGS. 13 to 15 are diagrams showing examples of using the concatenated BCH-LDPC encoding according to the second exemplary embodiment of the present invention.
Figure 14:
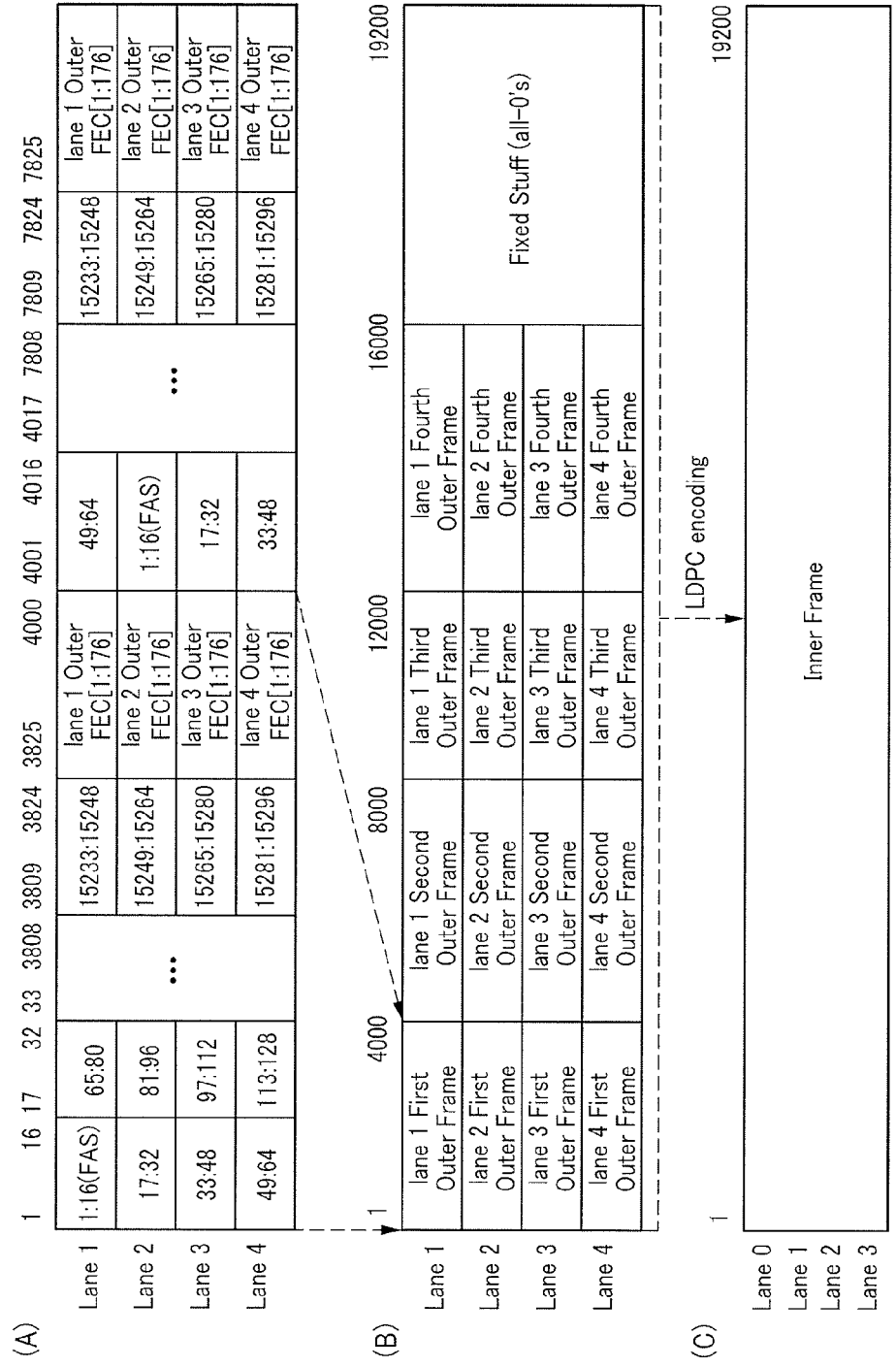
Figure 15:
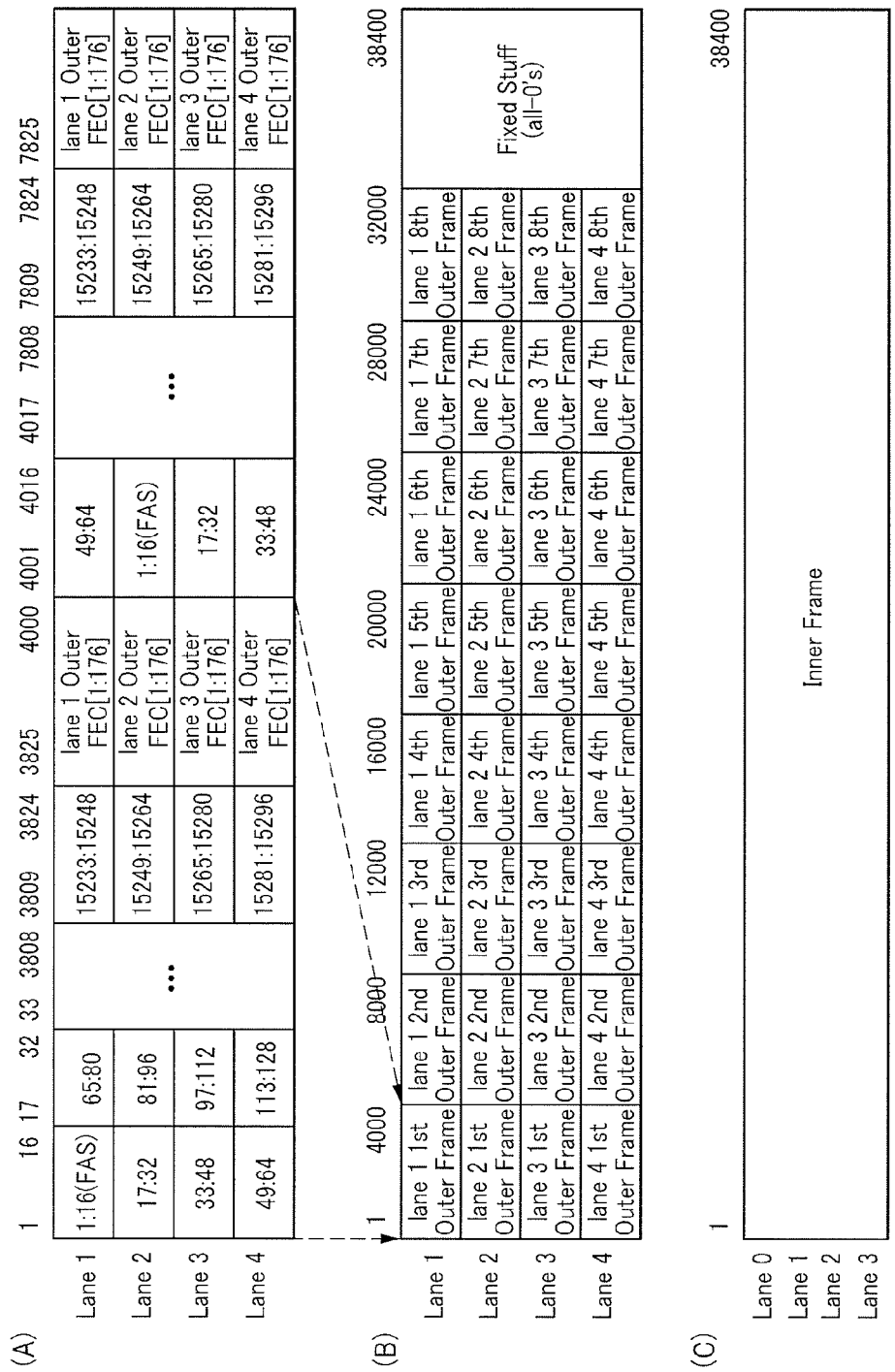

In addition, FIGS. 8 to 10 show one example of frames for each virtual lane according to the second exemplary embodiment of the present invention, and FIG. 11 shows one example of interleaving of a subframe according to the second exemplary embodiment of the present invention. Moreover, FIG. 12 is a diagram showing one example using a concatenated BCH-BCH encoding method according to the second exemplary embodiment of the present invention, and FIGS. 13 to 15 are diagrams showing examples of using the concatenated BCH-LDPC encoding according to the second exemplary embodiment of the present invention.

Referring to FIG. 7, the transmitting apparatus includes a mapper 310, an FEC encoder 320, and a transmitter 330.

The mapper 310 divides the input information data into blocks of 16 byte units. The blocks are mapped to four virtual lanes. The information data may be input in the ODU form or in the OTU form. In addition, although the second exemplary embodiment of the present invention describes the case where the size of the block is divided into a 16 byte units by way of example, the present invention can be applied to the case where the size of the block is changed to 8 bytes, 32 bytes, etc.

The mapper 310 assigns the FAS to one of the plurality of virtual lanes at each frame period. The virtual lane in which the FAS is positioned is selected to be circulated at each frame period. In addition, the FAS is assigned to a first block of blocks that are mapped to the selected virtual lane. Referring to FIG. 8, when there are four virtual lanes (lane 1 to lane 4), the mapper 310 assigns the FAS to the first block of lane 1 at the first frame period. The FAS is assigned to the first blocks of lane 2 at the next frame period, and the FAS is assigned to the first block of lane 3 at the following frame period.

Meanwhile, in the second exemplary embodiment of the present invention, the mapper 310 can map the blocks by the following two methods.

First, as shown in FIG. 8, the mapper 310 can use a method that divides the information data into the blocks of 16 byte units and sequentially assigns each block to the virtual lanes.

Second, as shown in FIG. 9, the mapper 310 can use a method that generates the plurality of groups by grouping the plurality of consecutive blocks and maps each group to the corresponding virtual lanes. The number of groups that are grouped is the same as the number of virtual lanes. In this case, as shown in FIG. 9, the mapper 310 performs the grouping in 3824 byte (239 block) units and maps each group of a 3824 byte size to each virtual lane (lane 1 to lane 4). Therefore, since the mapper 310 needs a memory of 3824 bytes for each group during the grouping, it increases the memory amount as compared to the first method. Moreover, it causes considerable delay by grouping each block in the plurality of groups and then performing the mapping for each virtual lane.

Meanwhile, although the second embodiment of the present invention describes the case where there are four virtual lanes by way of example, the present invention can be applied even when the number of virtual lanes is two or more. Herein, the number of virtual lanes can be changed according to the number of transmission channels, and the virtual lanes can be implemented as a multiple of the number of transmission channels. For example, when the number of transmission channels is four, the number of virtual lanes may be 4, 8, 12, 16, 20, . . . , etc.

The FEC encoder 320 performs the FEC encoding on each virtual lane to generate the parity bytes. The virtual frame corresponding to each virtual lane is output by positioning the generated parity bytes following the information data of the corresponding virtual lane.

Meanwhile, in the second exemplary embodiment of the present invention, the FEC encoder 320 can use a 16 channel RS (255, 239) encoding method, a concatenated BCH (Bose-Chaudhuri-Hocquenghem)-BCH encoding method, a concatenated BCH-LDPC (low-density parity-check code) encoding method, etc., as the FEC encoding method.

First, when using the RS (255, 239) encoding method of 16 channels, each RS (255, 239) channel generates the parity byte of 16 bytes. Therefore, the FEC encoder 320 generates the parity bytes of 256 bytes through the RS (255, 239) of 16 channels, and as shown in FIG. 8, generates the virtual frame of 4080 bytes including the information data of 3824 bytes and the parity bytes of 256 bytes.

Herein, each RS (255, 239) channel provides the error correcting performance of a maximum 8 bytes, and provides the error correcting performance of 128 bytes through the RS (255, 239) of the consecutive 16 channels. Therefore, the parity bytes generated for each virtual lane provides the error correcting performance for the errors of a maximum 128 bytes that occur in the corresponding virtual lane.

Meanwhile, in the case of using the concatenated BCH-BCH encoding method, the FEC encoder 320 performs BCH (3908, 3824) of 8 channels, interleaving, and BCH (2042, 1954) of 16 channels for each virtual lane.

In the concatenated BCH-BCH encoding method, since each BCH (3908, 3824) channel generates the parity bit of 84 bits and the error correcting performance of 7 bits, BCH (3908, 3824) of a total of 8 channels generates the parity byte of a total of 84 bytes and provides the error correcting performance of 7 bytes. In addition, since each BCH (2042, 1954) channel generates the parity bit of 88 bits and provides the error correcting performance of 8 bits, BCH (2042, 1954) of a total of 16 channels generates the parity byte of a total of 176 bytes and provides the error correcting performance of 16 bytes. Therefore, the parity byte of a total of 260 (=84+176) bytes for each virtual lane is generated by the concatenated BCH.

Meanwhile, the FEC encoder 320 disposes the parity byte of 85 bytes generated through BCH (3908, 3824) of 8 channels following the information data of 3824 bytes of the corresponding virtual lane as shown in FIG. 10, that is, from the 3825 column to the 3908 column. Thereafter, the FEC encoder 320 interleaves subframes included in each virtual lane in order to improve the error correcting performance between the concatenated BCHs for each virtual lane. In other words, each virtual lane includes subframes of 4084 byte units and the FEC encoder 320 interleaves and disposes subframes of 4084 bytes.

FIG. 11 shows one example of the interleaving. For interleaving, the FEC encoder 320 first generates the parity byte of 84 bytes through the outer BCH (3908, 3824) encoding of 8 channels as described above, and disposes from the 3825 column to the 3908 column after the information data of 3824 bytes. In addition, in order to dispose the parity byte of 176 bytes generated through the inner BCH (2042, 1954) encoding of 16 channels, a value of "0" is filled from the 3909 column to the 4084 column. A data set from the 1 column to the 4084 column, which is disposed as described above, is referred to as one subframe.

Meanwhile, the FEC encoder 320 divides the subframe configured of 4084 columns corresponding to 4084 bytes in 1021 symbols in 4 byte units. As shown in FIG. 9, in 8 subframes input to each virtual lane, the interleaving is performed by a method of sequentially selecting and disposing one symbol. In other words, when there are subframes from #n−7-th to #n-th, the first symbol of the #n-th subframe is selected as the first symbol of the interleaved subframe. Next, the second symbol of the #n−1-th subframe is selected as the second subframe of the interleaved subframe. By this method, the FEC encoder 320 performs the interleaving by the method of disposing each symbol selected from #n-th to #n−7-th subframes in a sequentially interleaved subframe. By the method, the interleaved subframe of 4084 bytes columns can be finally generated by sequentially selecting the symbols one by one in 8 subframes.

Meanwhile, the foregoing interleaving method can be applied to the concatenated BCH-LDPC encoding method as will be described below. For example, the subframes configured of 4000 byte columns are made by BCH (2000, 1912) of 16 channels. Therefore, one subframe is divided into 250 symbols in 16 byte units, and the FEC encoder 320 can perform the interleaving by a method of disposing a sequentially selected symbol in 8 subframes in the interleaved subframe as described above.

After the interleaving, the FEC encoder 320 generates the parity byte of 176 bytes through the BCH (2042, 1954) of 16 channels and disposes it following data of 3908 bytes of the corresponding virtual lane, as shown in FIG. 12. Therefore, the virtual frame of each virtual lane further includes the parity byte of 260 bytes in addition to the information data of 3824 bytes, thereby including data of total 4084 bytes.

Meanwhile, in the case of using the concatenated BCH-LDPC encoding method, the FEC encoder 320 performs the encoding by the following three methods.

First, in the case of using the first concatenated BCH-LDPC encoding method, the FEC encoder 320 performs BCH (2000, 1912) for 16 channels for each virtual lane, interleaving, and LDPC (19200, 16000) of 8 channels.

Herein, each BCH (2000, 1912) channel generates a parity bit of 88 bits and provides the error correcting performance of 8 bits. Therefore, the BCH (2000, 1912) of 16 channels generates the parity byte of 176 (=64×88 bits) bytes and provides the error correcting performance of 16 bytes.

In addition, each LDPC (19200, 16000) channel generates the encoded data of 6 bits of which 1 bit is added to the information data of 5 bits. Therefore, each LDPC (19200, 16000) channel for each virtual lane generates a redundancy bit of 3200 bits in addition to the information data of a total of 16000 bits. Therefore, the redundancy bytes of 3200 bytes are added by LDPC (19200, 16000) of 8 channels. Thereby, the FEC encoder 320, which uses the first concatenated BCH-LDPC encoding method, generates the redundancy byte of 3376 (=176+3200) bytes in addition to the information data of each virtual lane through the concatenated BCH-LDPC.

Meanwhile, the FEC encoder 120 disposes the parity byte of 176 bytes generated by performing BCH (2000, 1912) of 16 channels for each virtual lane following the information data of 3824 bytes of the corresponding virtual lane as shown in FIG. 13(a), thereby generating an outer frame of 4000 bytes. As shown in FIG. 13(b), after interleaving data between the outer frames generated for each virtual lane, four interleaved outer frames are grouped in one group. At this time, after the outer frame grouping, 3200 bits of which value is 0 are disposed. As shown in FIG. 13(c), the encoded bytes of 19200 bytes are generated through the LDPC (19200, 16000) of 8 channels for four outer frames grouped in one group for each virtual lane, and the encoded byte is disposed in 3200 bytes following four outer frame positions and grouped outer frames, thereby generating the virtual frame of a total of 19200 bytes for each virtual lane.

Using the second concatenated BCH-LDPC encoding method, the FEC encoder 320 performs BCH (2000, 1912) of 16 channels and the interleaving for each virtual lane, and performs LDPC (76800, 64000) of 8 channels for the entire virtual lanes.

As described above, BCH (2000, 1912) of 16 channels for each virtual lane generates the parity byte of 176 (=64×88 bits) bytes and provides the error correcting performance of 16 bytes. In addition, each LDPC (76800, 64000) channel for the entire virtual lane generates the encoded data of 6 bits of which 1 bit is added to the information data of 5 bits. Since the information data used in the inner frame are 64000 bytes (16000×4) in the entire virtual lane, the redundancy bytes of all 12800 bytes of 8 channels are added by LDPC (76800, 64000). Thereby, the redundancy byte of all 3376 (=176+ 12800/4) bytes is generated in addition to the information data for each virtual lane by the second concatenated BCH-LDPC method.

Meanwhile, the FEC encoder 120 disposes the parity byte of 176 bytes generated by performing the parity bytes of 176 bytes generated through BCH (2000, 1912) of 16 channels for each virtual lane following the information data of 3824 bytes of the corresponding virtual lane as shown in FIG. 14(a), thereby generating an outer frame of 4000 bytes. As shown in FIG. 13(b), after interleaving data between the outer frames generated for each virtual lane, four outer frames interleaved in all the virtual lanes are grouped in one group. Therefore, in FIG. 14(b), four outer frames for each of four virtual lanes are disposed by being grouped in one group, thereby treating all 16 outer frames for the entire virtual lane as one information data. In addition, as shown in FIG. 14 (c), 16 outer frames grouped in one group are encoded through LDPC (76800, 64000) of 8 channels to add the redundancy of all 12800 bytes, thereby generating the virtual frames of a total of 19200 bytes for each virtual lane.

In the case of using the third concatenated BCH-LDPC encoding method, the FEC encoder 320 performs the BCH (2000, 1912) of 16 channels, and the interleaving for each virtual lane and performs LDPC (153600, 128000) of 8 channels for the entire virtual lane.

As described above, the BCH (2000, 1912) of 16 channels for each virtual lane generates the parity byte of 176 (=64×88 bits) and provides the error correcting performance of 16 bytes. Further, each LDPC (153600, 128000) channel for the entire virtual lane generates the encoded data of 6 bits of which 1 bit is added to the information data of 5 bits. In the entire virtual lane, since the information data used in the inner frame is 128000 bytes (32000×4), the redundancy bytes of all 25600 bytes are added by LDPC (153600, 128000) of 8 channels. Thereby, the redundancy bytes of all 6576 (=176+ 12800/4) bytes in addition to the information data are generated by the third concatenated BCH-LDPC encoding method.

Meanwhile, the FEC encoder 120 disposes the parity byte of 176 bytes generated by performing BCH (2000, 1912) of 16 channels for each virtual lane following the information data of 3824 bytes of the corresponding virtual lane as shown in FIG. 15(a), thereby generating an outer frame of 4000 bytes. As shown in FIG. 15(b), after interleaving data between the outer frames generated for each virtual lane, eight outer frames interleaved in all the virtual lanes are grouped in one group. Therefore, in FIG. 15(b), eight outer frames corresponding to each of four virtual lanes are grouped in one group, that is, all 32 outer frames is grouped in one group to be treated as one information data. In addition, as shown in FIG. 15(c), LDPC (153600, 128000) of 8 channels for 32 outer frames grouped in one group is performed to add the redundancy of 25600 bytes, thereby generating the virtual frames of a total 38400 bytes for each virtual lane.

The transmitter 330 generates the transmission frame including the plurality of virtual frames generated for the plurality of virtual lanes, and transmits it through at least one transmission channel. Herein, since the number of virtual lanes exists as a multiple of the number of transmission channels, the virtual frame of at least one virtual lane is transmitted through one transmission channel, and thus the parity byte assigned to one virtual lane is transmitted through one transmission channel.

Therefore, each transmission channel can perform the error correction independently from other transmission channels, such that the error correcting performance of each transmission channel improves the entire error correcting performance without being affected by the errors occurring in other transmission channels, unlike the existing method. For example, when the number of virtual lanes and transmission channels is four, the error correction up to a total of 128 bytes for each transmission channel can be made by using the RS (255, 239) encoding method of 16 channels, and the error correction of a total of 512 (=128×4) bytes can be made through the entire transmission channel. In addition, when the number of virtual lanes is four and the number of transmission channels is 1, the error correction of a total of 512 (=128×4) bytes can be made through one transmission channel.

Referring again to FIG. 7, the receiving apparatus includes a receiver 410, an FEC decoder 420, and a demapper 430.

The receiver 410 uses the FAS included in the signal received through at least one transmission channels to detect the virtual frame for each virtual lane. It compensates and outputs the delay between the virtual lanes of the virtual frames detected based on the FAS position in the detected virtual frame. When the transmitting apparatus transmits data, since it is selected to circulate the virtual lane to which the FAS is assigned at each frame period and transmits the FAS through the first block of the selected virtual lane, the receiver 410 can confirm the position of the virtual frame for each virtual lane according to the position of the FAS.

The FEC decoder 420 uses the parity bytes included in the delay compensated virtual frame to perform the independent FEC decoding for each virtual lane, thereby performing the error correction for each virtual lane and outputting the error corrected information data for each virtual lane.

Meanwhile, as an FEC decoding method according to the second exemplary embodiment of the present invention, an RS (255, 239) decoding method of 16 channels, a decoding method of BCH (3908, 3824) of 8 concatenated channels—BCH (2042, 1954) of 16 channels, or a decoding method of BCH (2000, 1912) of 64 channels—LDPC (19200, 16000) of 8 channels, etc., can be used. Therefore, the error correction for each virtual lane can be made.

The demapper 430 divides the information data that is error-corrected and output for each virtual lane into a block in a 16 byte unit, and demaps each block and outputs it in the ODU form.

Figure 16:
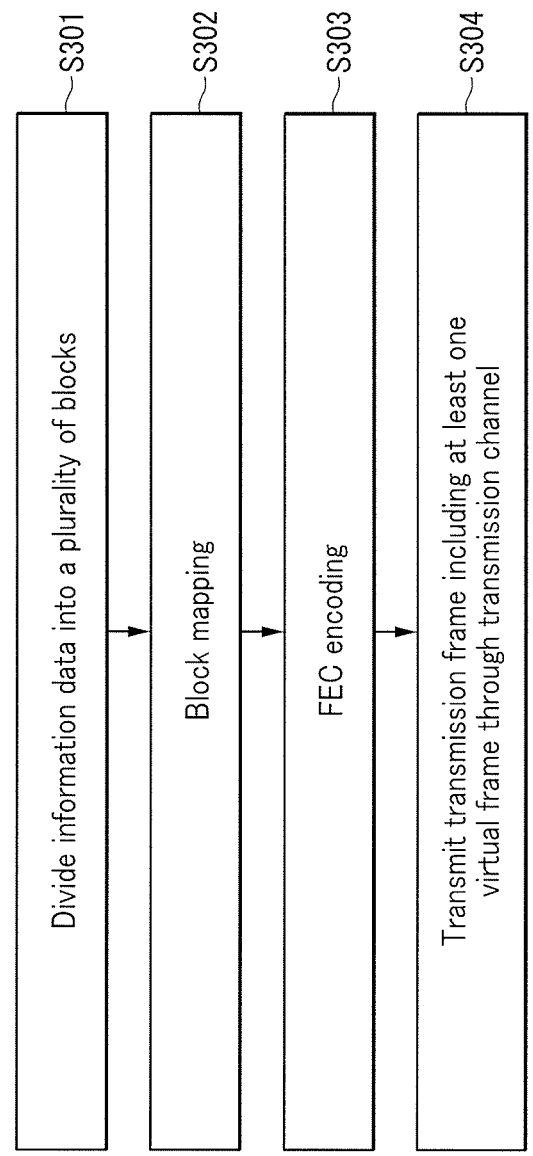
FIG. 16 is a flowchart showing a method for transmitting data in an optical transport network according to the second exemplary embodiment of the present invention.

FIG. 16 is a flowchart showing a method for transmitting data in an optical transport network according to the second exemplary embodiment of the present invention.

Referring to FIG. 16, the transmitting apparatus divides the information data input through the mapper 310 into a block of 16 byte units (S301). It maps each block to each of the plurality of virtual lanes (S302). The mapper 310 can map the blocks by a method of sequentially assigning blocks to the virtual lanes, or a method of grouping a plurality of consecutive blocks in a group corresponding to the number of virtual lanes, and then maps each group for each virtual lane.

Thereafter, the transmitting apparatus performs independent FEC encoding for each virtual lane through the FEC encoder 320 to generate the parity bytes (S303). It generates the virtual frame that includes the information data and the parity bytes for each virtual lane.

It generates the transmission frame including the virtual frames generated for each virtual lane through the transmitter 330, and transmits it through at least one transmission channel (S304). The transmitter 330 transmits the virtual frame of at least one virtual lane through one transmission channel.

Figure 17:
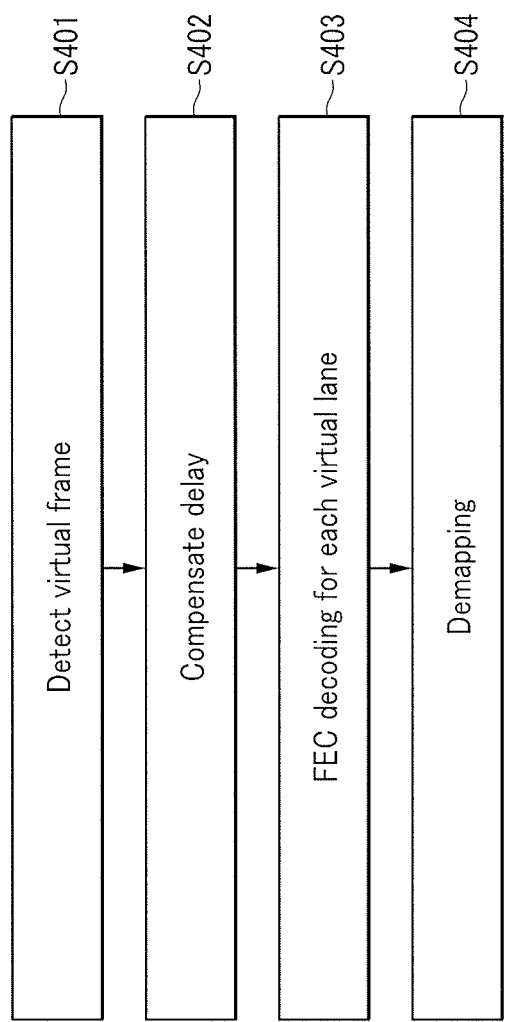
FIG. 17 is a flowchart showing a method for receiving data in the optical transport network according to the second exemplary embodiment of the present invention.

FIG. 17 is a flowchart showing a method for receiving data in the optical transport network according to the second exemplary embodiment of the present invention.

Referring to FIG. 17, the receiving apparatus detects the virtual frame for each virtual lane from the signal received through the receiver 410 (S401), and compensates and outputs the delay of the virtual frame for each virtual lane (S402). The receiver 210 detects the FAS included in the received signal and uses it to confirm the position of the corresponding virtual frame for each virtual lane, thereby compensating the delay between the virtual lanes.

Thereafter, the receiving apparatus performs the FEC decoding for each virtual lane through the FEC decoder 420 to perform the error correction (S403), and outputs the error corrected information data for each virtual lane.

It divides the error corrected information data for each virtual lane through the demapper 430 into a block of 16 byte units, and demaps each block to output it in the ODU form (S404).

As described above, in the second exemplary embodiment of the present invention, the FEC encoding is independently made for each virtual lane corresponding to a multiple of the number of transmission channels, and the parity byte of one virtual lane is transmitted through one transmission channel. Thereby, the receiving apparatus can receive independent parity bytes for each transmission channel and can perform the independent error correction without being affected by the errors occurring in other transmission channels, unlike the existing method. Accordingly, even though a considerable amount of errors corresponding to about 1E-4 in all the remaining transmission channels except for one transmission channel occur, the burst errors of a maximum of 128 bytes can be corrected in one transmission channel regardless of the amount of errors, such that the optimized transmitting/receiving apparatus can be provided in the case of performing the parallel transmission in the multiple transmission channels.

In addition, it is possible to independently collect the number of error corrections for each transmission channel to monitor the performance for each transmission channel.

According to the exemplary embodiment of the present invention, independent error correction can be performed in each transmission channel without being affected by errors occurring in other transmission channels, and burst errors of a maximum of 128 bytes can be corrected in one transmission channel regardless of the errors even when a considerable amount of errors occur in all the remaining transmission channels except for one transmission channel, thereby making it possible to provide an optimized transmitting/receiving apparatus in the case of performing parallel transmission in the multiple transmission channels.

In addition, the number of error corrections for each transmission channel is independently collected, thereby making it possible to monitor the performance for each transmission channel.

The above-mentioned exemplary embodiments of the present invention are not embodied only by an apparatus and method. Alternatively, the above-mentioned exemplary embodiments may be embodied by a program performing functions that correspond to the configuration of the exemplary embodiments of the present invention, or a recording medium on which the program is recorded. These embodiments can be easily devised from the description of the above-mentioned exemplary embodiments by those skilled in the art to which the present invention pertains.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for transmitting data by a transmitting apparatus in a transport network, comprising:
    generating parity bytes by performing forward error correcting encoding on input information data;
    dividing the input information data and the parity bytes into a plurality of blocks;
    generating frames comprising a plurality of virtual frames corresponding to a plurality of virtual lanes by mapping the plurality of blocks to the plurality of virtual lanes,
    wherein the generating the frame further comprises assigning a frame assignment sequence of a current frame period to the virtual frames of a first virtual lane of the plurality of virtual lanes, and
    wherein the first virtual lane being different from a second virtual lane to which a frame assignment sequence is assigned in a previous frame period; and
    transmitting the generated frames through at least one transmission channel.

2. The method for transmitting data of claim 1, wherein the generating the frames comprises:
    sequentially mapping the plurality of blocks to the plurality of virtual lanes.

3. The method for transmitting data of claim 1, wherein the generating the frames comprises:
    grouping the plurality of blocks into a plurality of groups; and
    mapping each of the plurality of groups to a different virtual lane of the plurality of virtual lanes.

4. The method for transmitting data of claim 1, wherein a number of the plurality of virtual lanes is determined by a number of transmission channels, and
    each virtual frame is transmitted through only one transmission channel from the number of transmission channels.

5. A method for receiving data by a receiving apparatus in a transport network, comprising:
    detecting a plurality of virtual frames each corresponding to a plurality of virtual lanes by using a frame assignment sequence comprised in signals received through at least one transmission channel, and
    the frame assignment sequence is assigned based on of a current frame period to the virtual frames of a first virtual lane of the plurality of virtual lanes, and
    wherein the first virtual lane being different from a second virtual lane to which a frame assignment sequence is assigned in a previous frame period;
    dividing the plurality of virtual frames into a plurality of blocks;
    generating information data and parity bytes by demapping the plurality of blocks;
    performing error correction on the information data based on the parity bytes; and
    generating transmission data based on the error corrected information data.

6. The method for receiving data of claim 5, wherein the detecting the plurality of virtual frames comprises:
    compensating a virtual frame delay between the plurality of virtual lanes based on each different virtual frame from the plurality of virtual frames comprising the frame assignment sequence of the plurality of virtual frames.

7. A method for transmitting data by a transmitting apparatus in a transport network, comprising:
    dividing input information data into a plurality of blocks;
    mapping the plurality of blocks to a plurality of virtual lanes,
    wherein the mapping further comprises selecting a second virtual lane that is different from a first virtual lane of the plurality of virtual lanes; and
    assigning a frame assignment sequence to a first block of the plurality of blocks that are mapped to the virtual frame of the second virtual lane,
    the first virtual lane being a virtual lane to which the frame assignment sequence is assigned in a previous frame;
    generating parity bytes for the plurality of virtual lanes by performing forward error correcting encoding on the plurality of virtual lanes;
    generating virtual frames comprising the blocks and the parity bytes different blocks from each of the plurality of blocks for each of the plurality of virtual lanes; and
    transmitting only the plurality of virtual frames generated for each of the plurality of virtual lanes through at least one transmission channel.

8. The method for transmitting data of claim 7, wherein the mapping comprises:
    sequentially mapping the plurality of blocks to the plurality of virtual lanes.

9. The method for transmitting data of claim 7, wherein the mapping comprises:
    grouping the plurality of blocks into a plurality of groups; and
    mapping each of the plurality of groups to a different virtual lane of the plurality of virtual lanes.

10. The method for transmitting data of claim 7, wherein the generating the parity bytes includes
    generating the parity bytes by performing encoding on each of the plurality of virtual lanes,
    the encoding including at least one encoding of RS (Reed-Soloman) encoding, concatenated BCH (Boss-Chaudhuri-Hocquenghen)-BCH encoding, and BCH-LDPC (low-density parity-check code) encoding.

11. The method for transmitting data of claim 7, wherein the generating the parity bytes comprises:
    generating first parity bytes by performing BCH (Boss-Chaudhuri-Hocquenghen) encoding on each of the plurality of virtual lanes;
    generating a plurality of outer frames by grouping the first parity bytes and the input information data corresponding to the plurality of virtual lanes; and generating second parity bytes by performing LDPC (low-density parity-check code) encoding on the plurality of outer frames.

12. The method for transmitting data of claim 7, wherein the number of the plurality of virtual lanes is determined by a number of transmission channels.

13. The method for transmitting data of claim 12, wherein the transmitting comprises:
transmitting at least one virtual lane of the plurality of virtual lanes through one transmission channel from the number of transmission channels.

14. A method for receiving data by a receiving apparatus in a transport network, comprising:
detecting a frame assignment sequence included in a signal received through at least one transmission channel;
detecting virtual frames comprising information data and parity bytes for each of a plurality of virtual lanes by using the frame assignment sequence,
wherein the frame assignment sequence is assigned based on of a current frame period to the detected virtual frames of a first virtual lane of the plurality of virtual lanes, and
wherein the first virtual lane being different from a second virtual lane to which a frame assignment sequence is assigned in a previous frame period;
performing error correction on the information data and the parity bytes by performing forward error correcting decoding on each of the plurality of virtual lanes; and
outputting a transmission data by demapping the error corrected information data.

15. The method for receiving data of claim 14, further comprising
compensating a delay of the virtual frames corresponding to each of the plurality of virtual lanes based on a position of the frame assignment sequence.

16. The method for receiving data of claim 14, wherein the outputting the transmission data comprises:
dividing the error corrected information data into a plurality of blocks; and
outputting the transmission data by demapping the plurality of blocks.

* * * * *